(12) United States Patent
Pentakota et al.

(10) Patent No.: US 8,248,055 B2
(45) Date of Patent: Aug. 21, 2012

(54) VOLTAGE REFERENCE WITH IMPROVED LINEARITY ADDRESSING VARIABLE IMPEDANCE CHARACTERISTICS AT OUTPUT NODE

(75) Inventors: Visvesvaraya Appala Pentakota, Bangalore (IN); Anand Hariraj Udupa, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1030 days.

(21) Appl. No.: 12/128,640

(22) Filed: May 29, 2008

(65) Prior Publication Data

US 2009/0295363 A1  Dec. 3, 2009

(51) Int. Cl.
*G05F 3/16* (2006.01)
*G05F 1/648* (2006.01)
(52) U.S. Cl. ........................... 323/313; 323/297
(58) Field of Classification Search ................... 323/297, 323/298, 353, 354, 273, 274, 313, 314
See application file for complete search history.

(56) References Cited

U.S. PATENT DOCUMENTS

| | | | | |
|---|---|---|---|---|
| 5,281,906 A * | 1/1994 | Thelen, Jr. | | 323/313 |
| 5,838,145 A * | 11/1998 | Poon et al. | | 323/266 |
| 6,686,860 B2 * | 2/2004 | Gulati et al. | | 341/155 |
| 6,744,305 B2 * | 6/2004 | Oikawa et al. | | 327/541 |
| 6,937,179 B1 * | 8/2005 | Martin | | 341/154 |
| 7,068,205 B1 * | 6/2006 | Hastings et al. | | 341/164 |
| 7,166,826 B1 * | 1/2007 | Kunst et al. | | 250/205 |
| 7,208,919 B2 * | 4/2007 | May | | 323/211 |
| 7,209,060 B2 * | 4/2007 | Kumar et al. | | 341/118 |
| 7,573,414 B2 * | 8/2009 | Kumar et al. | | 341/155 |
| 2004/0249485 A1 * | 12/2004 | Bondarev et al. | | 700/71 |

* cited by examiner

*Primary Examiner* — Jue Zhang
*Assistant Examiner* — Henry Lee, III
(74) *Attorney, Agent, or Firm* — Alan A. R. Cooper; Wade James Brady, III; Frederick J. Telecky, Jr.

(57) ABSTRACT

A voltage reference containing a programmable resistance portion at an output node at which an output reference voltage is provided. The desired magnitude of the programmable portion which provides optimum matching of an output resistance of the voltage reference and a series resistance of an output capacitor of the voltage reference is determined and hard-programmed. As a result, the output voltage of the voltage reference is provided with improved linearity. In an embodiment, the determination of the magnitude of the programmable portion is performed by providing an input to an analog to digital converter (ADC) with the voltage reference driving the ADC. The resistance setting corresponding to the third harmonic being less than a desired threshold is then hard-programmed. In an alternative embodiment, the programmable portion is set to specific resistance dynamically during operation.

22 Claims, 11 Drawing Sheets

FIG. 9

VOLTAGE REFERENCE WITH IMPROVED LINEARITY ADDRESSING VARIABLE IMPEDANCE CHARACTERISTICS AT OUTPUT NODE

BACKGROUND

1. Field of the Invention

The present invention relates generally to the design on integrated circuits generating reference voltages, and more specifically to a voltage reference with improved linearity addressing variable impedance characteristics at an output node.

2. Related Art

A voltage reference generally refers to a component that ideally provides a fixed output voltage (reference voltage). The output voltage may be provided at an output node of the voltage reference. The components/devices driven by the voltage reference are generally connected at the output node potentially by a conductive path.

A voltage reference is said to be linear if the output voltage provided by the voltage reference remains constant or varies in a proportionately linear fashion as the load current drawn from the voltage reference varies. In general, if it is known that the voltage reference varies in a proportionate fashion, appropriate correction techniques can be employed, as is well known in the relevant arts.

As is also well-known in the relevant arts, impedance characteristics (impedance, also termed "looking-in impedance") at the output node are generally determined by the output impedance (which generally varies depending on the load current) of the voltage reference and the impedance of decoupling capacitor(s) typically connected at the output node of the voltage reference. The impedance characteristics at the output node cause variation in the output voltage based on the manner in which the load current drawn from the voltage reference varies.

Impedance characteristics at an output node of a voltage reference may vary on account of several factors. One factor contributing to such variation is the effective series resistance (ESR) of the decoupling capacitor (noted above), which may be different for different voltage references, at least across different fabrication/production batches. Due to the reasons noted above, impedance characteristics at the output node may vary. Thus, it may be difficult and/or inconvenient to provide a voltage reference with a desired minimum level of non-linearity.

Several aspects of the present invention provide a voltage reference with improved linearity addressing variable impedance characteristics at output node caused due to fabrication.

BRIEF DESCRIPTION OF THE DRAWINGS

The present invention will be described with reference to the following accompanying drawings, which are described briefly below.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

A voltage reference provided according to an aspect of the present invention contains a programmable resistance portion at an output node at which an output reference voltage is provided. The desired magnitude of the programmable portion which provides optimum matching of an output resistance of the voltage reference and a series resistance of an output capacitor of the voltage reference is determined. As a result, the output voltage of the voltage reference is provided with improved linearity.

According to an aspect of the present invention, the programmable resistance is hard-programmed with a desired magnitude. In an embodiment, the determination of the desired magnitude of the programmable portion is performed by providing an input to an analog to digital converter (ADC) with the voltage reference driving the ADC. The magnitude of the third harmonic of the output of the ADC is noted for various settings of the programmable portion. The resistance setting corresponding to the third harmonic being less than a desired threshold is then hard-programmed.

According to another aspect of the present invention, the programmable resistance is adjusted dynamically during operation. In an embodiment, the sampling frequency of an ADC is measured and the programmable resistance is adjusted to ensure that the sum of the output resistance and the programmable resistance portion substantially equals the series resistance of an output capacitor. In particular, the output resistance may vary with the sampling frequency and the programmable resistance may accordingly be adjusted to counter the changes in the output resistance.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well known structures or operations are not shown in detail to avoid obscuring the features of the invention.

2. Example Environment

Figure 1:
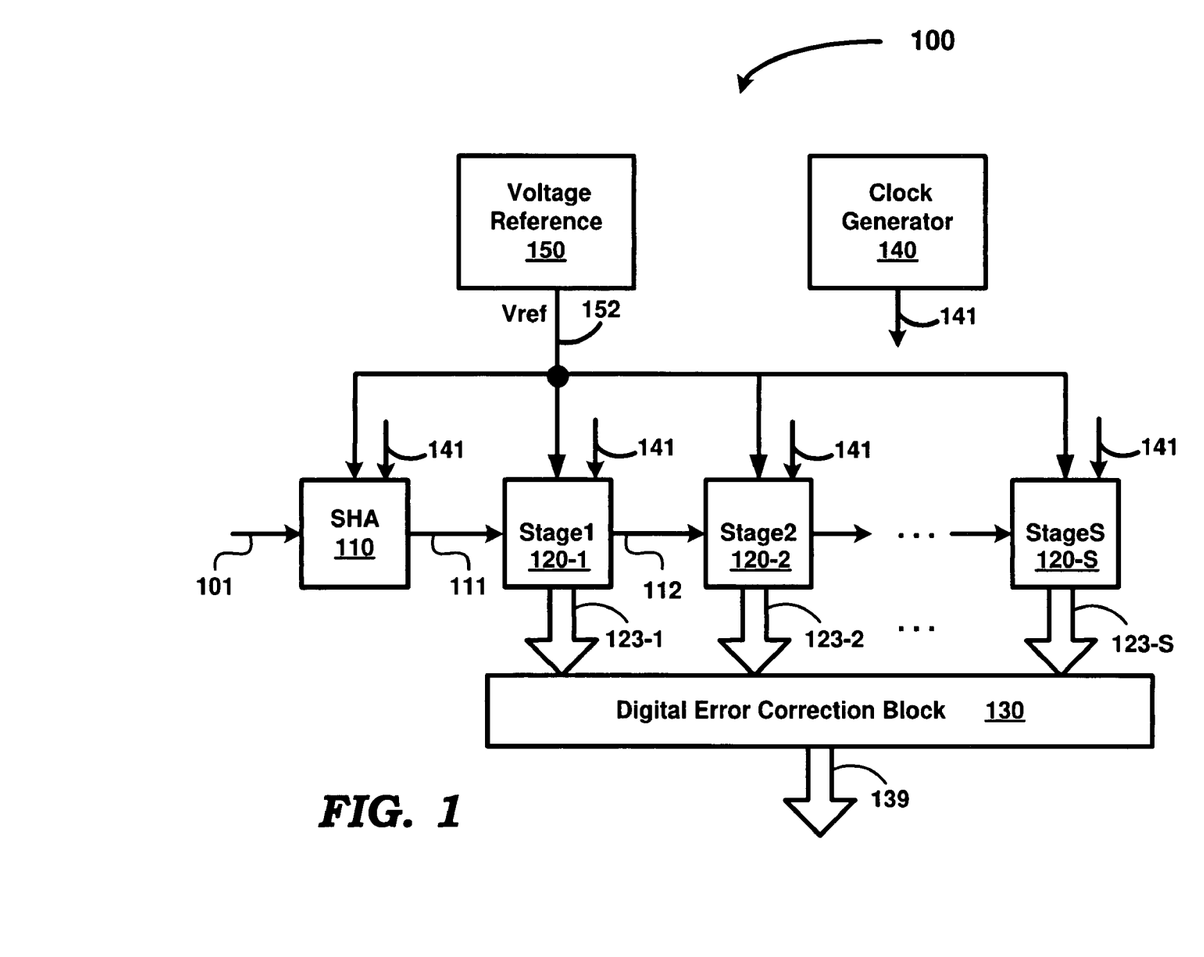
FIG. 1 is a block diagram illustrating the details of an example component in which several aspects of the present invention can be implemented.

FIG. 1 is a block diagram illustrating the details of an example component in which several aspects of the present invention can be implemented. It must be understood that the component of FIG. 1 is shown merely by way of illustration. However, several features of the present invention can be implemented in other environments. Pipeline ADC 100 is shown containing sample and hold amplifier (SHA) 110, stages 120-1 through 120-S, digital error correction block 130, clock generator 140, and voltage reference 150. Each block is described below in further detail.

Digital error correction block 130 receives sub-codes from various stages (on paths 123-1 through 123-S respectively), and generates a digital code representing the strength of a corresponding sample of the input signal received on path 101. Various error correction approaches, well known in the relevant arts, may be used to correct any errors in the received sub-codes. The generated digital code is provided on path 139 as a final digital code corresponding to the voltage of a sample on the input analog signal at a particular time instant.

SHA 110 samples the input signal received on path 101 and holds the sampled voltage level of the sample on path 111 for further processing.

Each stage 120-1 through 120-S generates a sub-code corresponding to a voltage level of a signal received as an input, and an amplified residue signal as an input to a (any) next stage. For example, stage 120-1 converts a voltage level on path 111 to generate a sub-code on path 123-1, and the amplified residue signal generated on path 112 is provided as an input to stage 120-2.

Clock generator 140 provides a sampling clock (path 141) specifying the sampling time instances (e.g., clock edges) at which input signal 101 as well as the corresponding inputs (paths 111, 112, etc.) to stages 120-1 through 120-S are sampled. The sampling time instances are determined by the desired sampling rate (inverse of the clock frequency).

Voltage reference 150 provides a voltage output 152 (reference voltage designated in FIG. 1 as Vref) which is connected to (corresponding internal circuitry in) stages 120-1 through 120-S, and SHA 110. Each of stages 120-1 through 120-S may compare the corresponding input signal with Vref 152 in generating the respective digital codes noted above. Although not shown in FIG. 1, voltage reference 150 may receive a power supply from an external source. As illustrated in greater detail below, output voltage 152 (Vref) may vary in a non-linear fashion due to changes in load current, at least in ADC type of environments.

3. Example Cause of Non-Linearity

Figure 2:
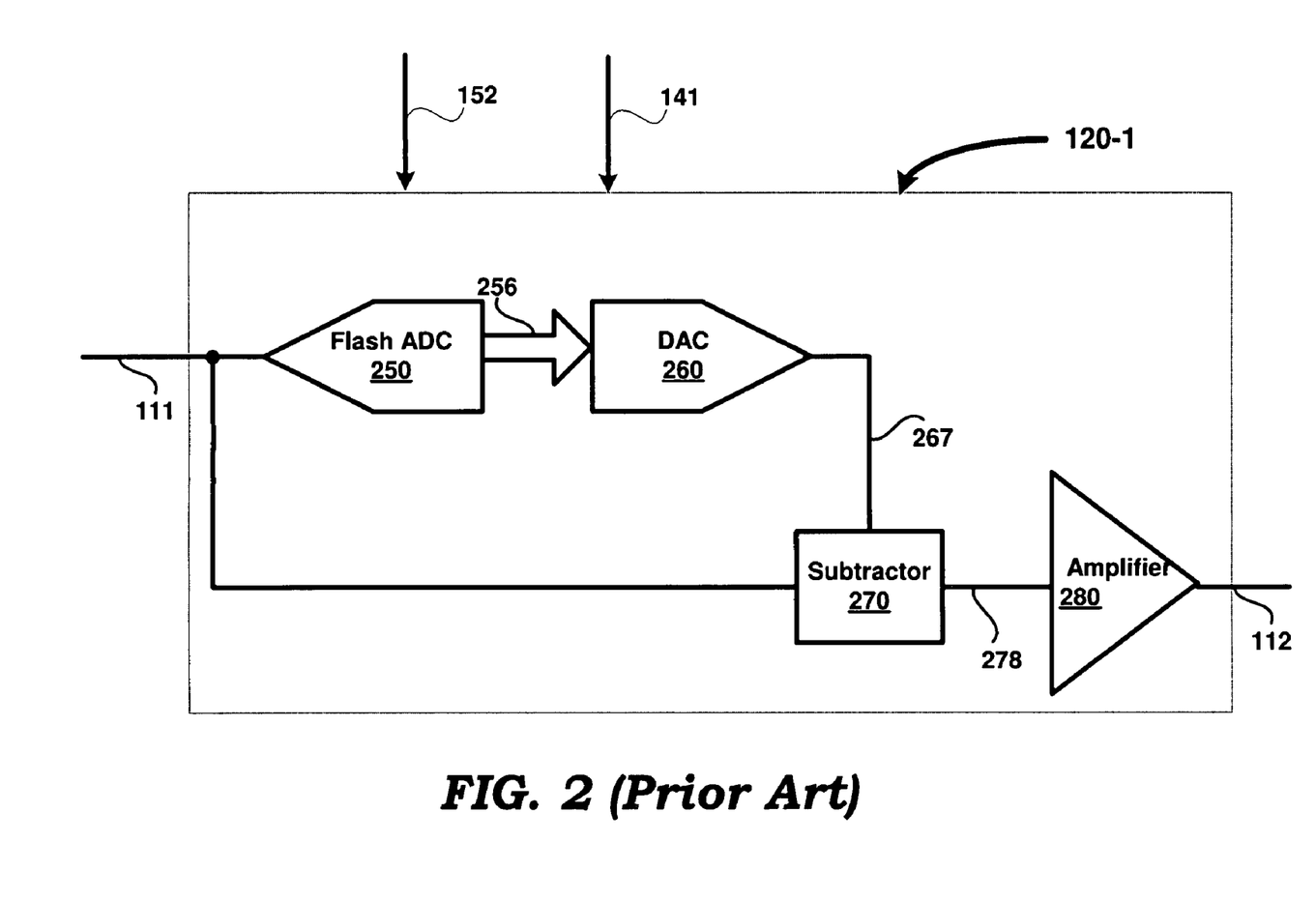
FIG. 2 illustrates the logical operation of a stage of a pipeline ADC.

FIG. 2 further illustrates the logical operation of a stage (described with reference to stage 120-1 only, for conciseness) of pipeline ADC 100 according to a known approach. With respect to FIG. 2, stage 120-1 is shown containing flash ADC 250, digital to analog converter (DAC) 260, subtractor 270 and amplifier 280. Sampling clock 141 is shown as being provided to stage 120-1, and determines the frequency with which input 111 is sampled. Flash ADC 250 (an example of a sub ADC) converts a sample of an analog signal received on path 111 into a corresponding P-bit sub-code provided on path 256 (contained in path 123-1 of FIG. 1, and P is less than N, where N is the number of bits in the final digital code provided on path 139 of FIG. 1).

DAC 260 converts the sub-code received on path 256 into corresponding analog signal (Vdac) on path 267. Vdac is generally proportionate to the sub-code and represents the analog equivalent of the resolved sub-code, as is well known in the relevant arts.

Subtractor 270 generates a residue signal on path 278 as the difference of sample 111 (Vi) and the analog signal received on path 267. Amplifier 280 amplifies the residue signal (Vi-Vdac) which is then provided on path 112 as an amplified residue signal. The signal on path 112 is used to resolve the remaining bits in the N-bit digital code by the subsequent stages of the ADC.

Vref 152 is shown as being provided to stage 120-1 for the operation of respective circuitry within the stage. Such circuitry may present a variable load to Vref 152, as may be better understood from a brief description of the internal details of stage 120-1 in one implementation.

4. Variable Load Presented to a Voltage Reference

Figure 3:
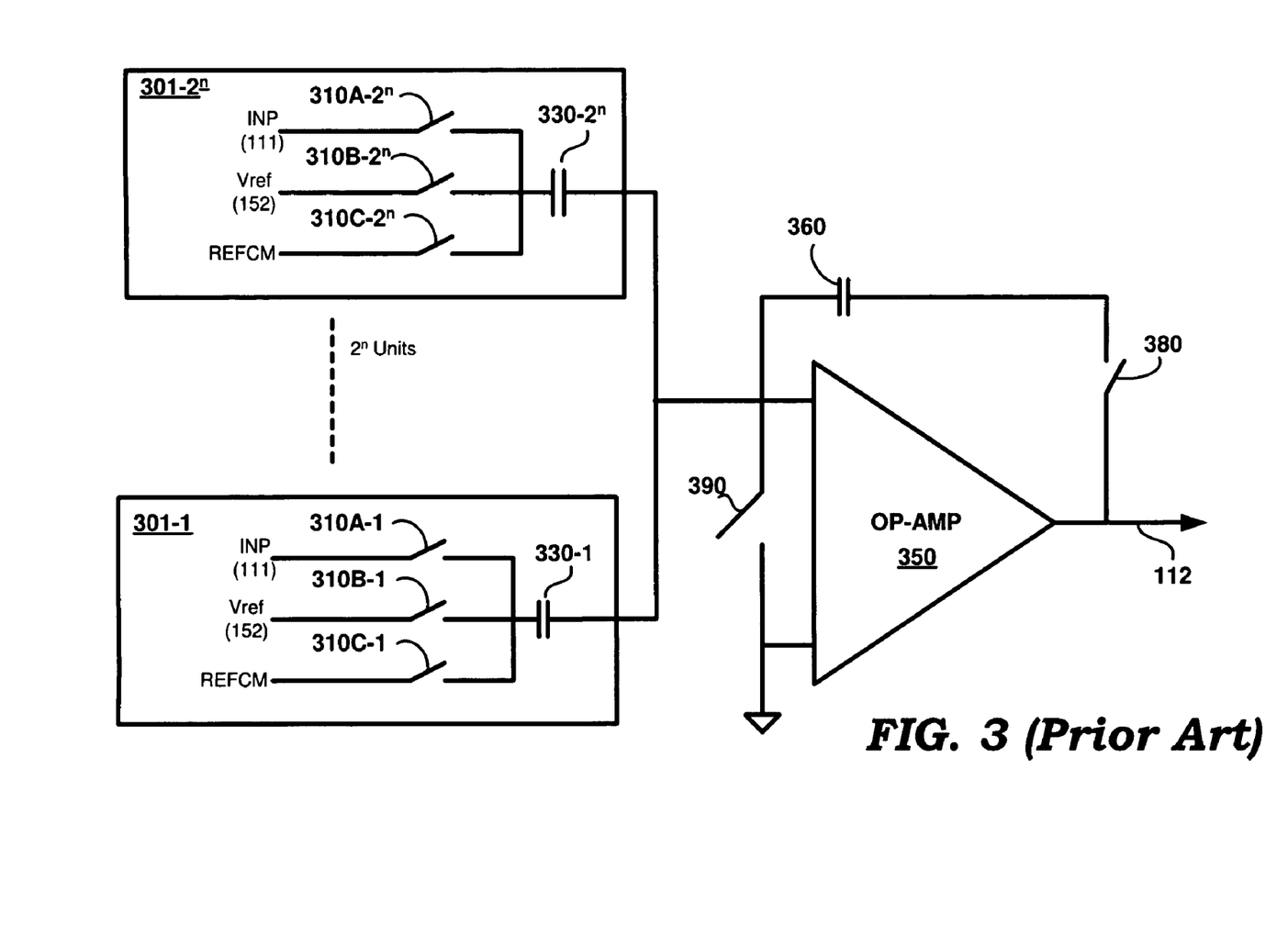
FIG. 3 is a circuit diagram illustrating the manner in which a DAC, subtractor and amplifier used in a stage of pipeline ADC are implemented in an embodiment.

FIG. 3 is a circuit diagram illustrating the manner in which DAC 260, subtractor 270, and amplifier 280 are implemented in an embodiment. The circuit diagram is shown containing operational amplifier (OPAMP) 350, feedback capacitor 360, feedback switch 380, switch 390, and circuit portions 301-1 through 301-2″. The circuit is referred to as a gain (or residue amplification) block and operates to provide the function of components DAC 260, subtractor 270 and amplifier 280. FIG. 3 shows a gain stage in a single ended implementation, but equivalent embodiments can be implemented in differential form also, in a known way.

Circuit portion 301-1 is shown containing sampling capacitor 330-1, and switches 310A-1, 310B-1, and 310C-1. The remaining circuit portions 301-2 through 301-2″ may also contain similar components, not all of which are shown/described in the interest of conciseness.

In operation, during a first (e.g., sampling) phase switches 310A-1 through 310A-2″ and switch 390 are closed, while switches 380, 310B-1 through 310B-2″, and 310C-1 through 310C-2″ are kept open. As a result, each sampling (input) capacitor 330-1 through 330-2″ is ideally charged to the voltage of input sample received on path 111. During a next (e.g., hold) phase, feedback switch 380 is closed, and switches 310A-1 through 310A-2″ as well as switch 390 are kept open.

Connections (on or off) of switches 310B-1 through 310B-2″, and 310C-1 through 310C-2″ are made such that the input terminals of each sampling capacitors 330-1 through 330-2″ is connected either to Vref (reference voltage received on path 152) or to REFCM terminal (which provides a common mode reference voltage), based on the corresponding output bits of comparators used in flash ADC 250 (FIG. 2). Each switch pair (such as switch pair 310B-1/310C-1) may be controlled by an output bit from a corresponding comparator used in flash ADC 250.

As a result, sampling capacitors 330-1 through 330-2″ transfer a charge proportional to the difference (residue) of input signal and Vref or REFCM to feedback capacitor 360. The residue is amplified by OPAMP 350 and provided on path 112 as amplified residue signal to the next stage, as desired.

Thus, it may be appreciated that whether Vref is connected or not to (specific ones of) sampling capacitors 330-1 through 330-2″ depends on the corresponding output bits of comparators used in flash ADC 250. In general, which ones of sampling capacitors 330-1 through 330-2″ is connected to Vref during a hold phase depends on the strength of the sample of input signal 111 at the corresponding sampling instant/interval. The (external) load (impedance) presented to voltage reference 150 may, therefore, vary in a non-linear fashion with time.

As a result, Vref (152) may also vary non-linearly. With respect to the example ADC of FIG. 1, such non-linearity may cause errors in the output codes provided by ADC 100. A prior technique that attempts to address some of the problems noted above is described next.

4. Prior Voltage Reference

Figure 4A:
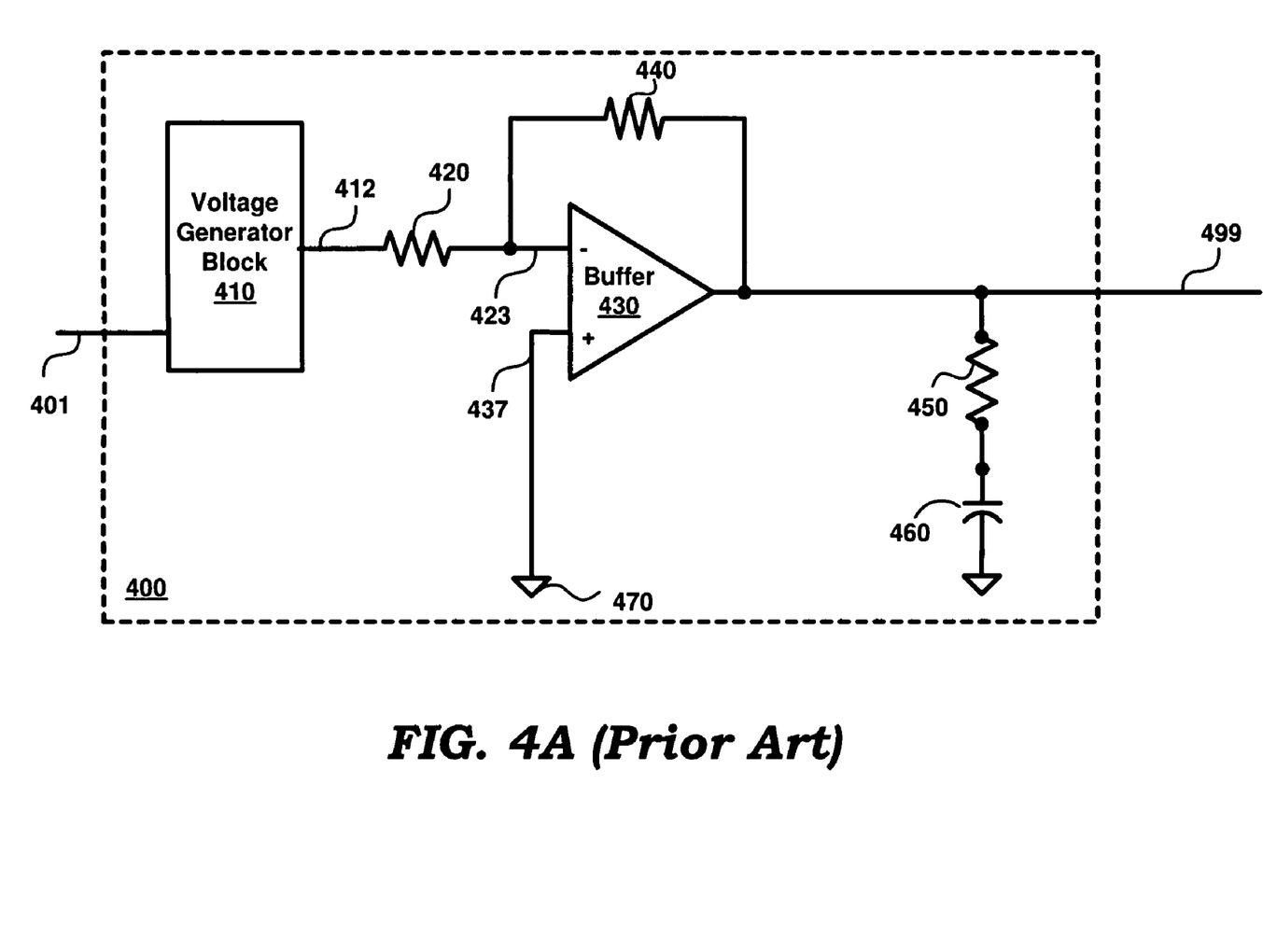
FIG. 4A is a block diagram of a voltage reference in a prior embodiment.

FIG. 4A is a diagram of a voltage reference in a prior embodiment. Prior voltage reference 400 is shown containing voltage generator block 410, buffer 430, resistors 420 and 440, and capacitor 460. Resistor 450 represents the effective series resistance (ESR) of capacitor 460, and may be due to N-well and poly-silicon resistance of the capacitor, etc. Terminal 470 represents ground (reference potential). Output path/node 499 of voltage reference 400 corresponds to path 152 of FIG. 1.

Voltage generator block 410 receives a power supply on path/node 401, and generates a fixed voltage on path/node 412. Voltage generator block 410 can be implemented using various well known techniques such as band gap reference, etc., well known in the relevant arts.

Buffer 430 (which may be implemented as an operational amplifier (OPAMP)) is shown connected in a inverting configuration, with resistors 440 and 420 being selected to provide a desired gain. Terminals 423 and 437 respectively represent the inverting and non-inverting terminals of buffer 430. Buffer 430 provides a buffered voltage output (output of voltage reference 400) on path 499.

Capacitor 460 represents the capacitance between the output terminal 499 and a reference terminal (usually ground 470), and may represent a sum of stray capacitance and one or more decoupling capacitors provided at output terminal 499. Resistor 450 represents the effective series resistance (ESR) of capacitor 460, as noted above.

Figure 4B:
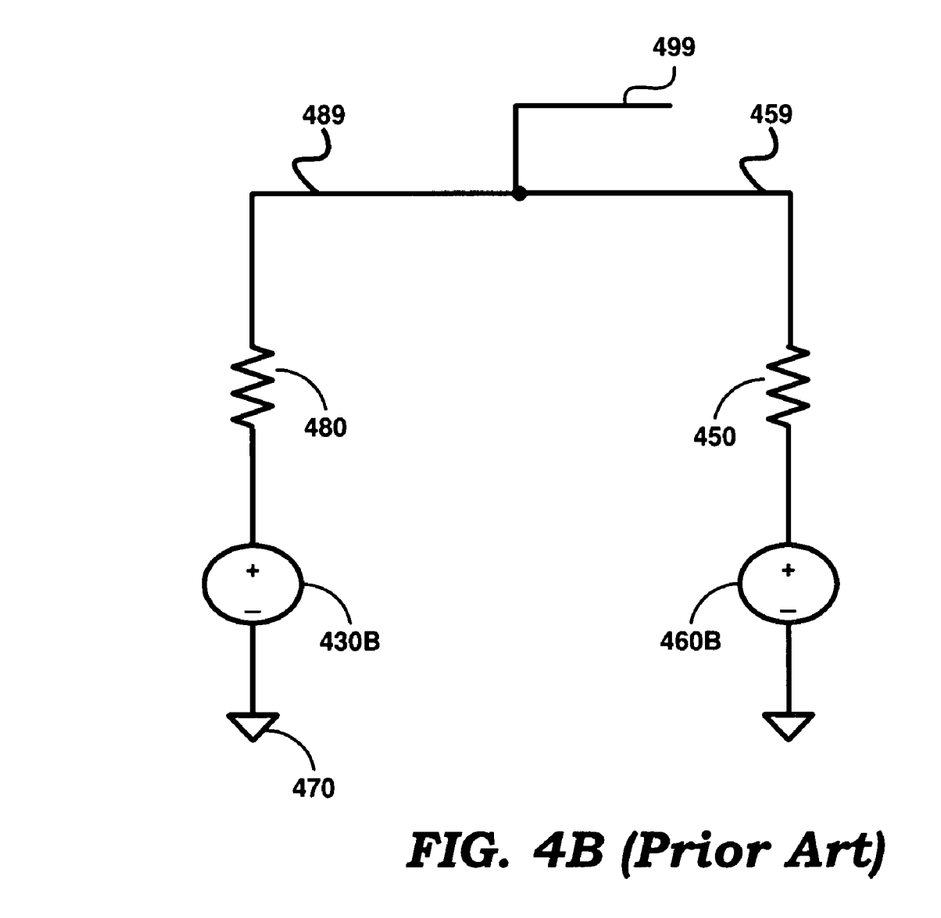
FIG. 4B is a diagram illustrating a circuit equivalent of portions of a prior voltage reference.

As load current varies (as noted above), both of buffer 430 and capacitor 460 may provide (respective currents) the total instantaneous load current, as illustrated in greater detail with respect to FIG. 4B, which illustrates a circuit equivalent of the relevant portions of the voltage reference of FIG. 4A. In FIG. 4B, voltage source 430B is an ideal representation of buffer 430, and voltage source 460B is an ideal representation of capacitor 460. Resistor 480 represents the output resistance of buffer 430, and may be viewed as including (in addition) any resistance of track/wiring from the output of buffer 430 to the output terminal 152.

The total load current noted above provided into path 499 is the sum of the currents supplied by voltage source 430B (along path 489) and by voltage source 460B (along path 459). In the prior voltage reference described above, non-linearity in the output voltage (provided at output terminal 499) is minimized (or cancelled) by making resistances 480 and 450 (ESR of capacitor 460 of FIG. 4A) equal in magnitude.

However, as noted in sections above, it may be difficult and/or inconvenient to precisely estimate and match (make equal) the values of resistances 480 and 450 prior to fabricating voltage reference 400. In particular (and as noted above), the value of resistance 450 may be different at least for different fabrication batches.

That is, assuming a first voltage reference is contained in a first batch of fabricated integrated circuits and a second voltage reference is contained in a second batch of fabricated integrated circuits (either within the same fabrication facility or another), the value of resistance 450 in the first voltage reference may not equal the value of resistance 450 in the second voltage reference. Such unequal resistance values may cause resistance mismatches in at least some of the voltage references. Specifically, the resistance of resistor 450 may not equal the resistance of resistor 480 in these voltage references. Non-linearities may be increased in the output voltage (path 499) due to such mismatch.

Further, the magnitude of output resistance 480 may depend on the bias current(s), not shown, but provided to components such as transistors, etc., contained in buffer 430 (FIG. 4A). In general, higher the magnitude of the bias current(s) provided to buffer 430, lower is the value of resistance 480.

Referring to FIG. 1, ADC 100 shown there may be operated over a wide range of sampling frequencies (frequency of sampling clock 141). The loading on voltage reference 150 (due to operation of stages 120-1 through 120-S as noted above) may depend on the sampling frequency of ADC 100, i.e., of sampling clock 141. In general, when the magnitude of bias currents provided to buffer 430 is higher, higher is the load current that can be supported by voltage reference 150 without (or with minimal) variations in Vref (152).

At lower sampling frequencies, it may be sufficient to provide correspondingly smaller bias currents to buffer 430 since the load current drawn (by stages 120-1 through 120-S) is lower. At higher sampling frequencies it may be necessary to provide correspondingly higher bias currents. Hence, it may be desirable to adjust the magnitude of bias currents based on the sampling frequency of ADC 100. For example, when operating ADC 100 at lower sampling frequencies the bias currents may be reduced to save power.

From the description above, it may be appreciated that output resistance 480 of buffer 430 is a function of operating speed (sampling frequency) of ADC 100. Therefore, it may be desirable to match the values of resistances 480 and 450 (FIG. 4B) based on (across the entire range of) the sampling frequencies as well. Several aspects of the present invention provide a voltage reference with improved linearity and providing the desirable features noted above, as described next with respect to example embodiments. While the example embodiments below are described as addressing the two specific problems noted above, it should be appreciated that various features of the present invention can be implemented to solve other problems as necessary in the specific environments where the features are deployed.

5. Voltage Reference with Improved Linearity

Figure 5:
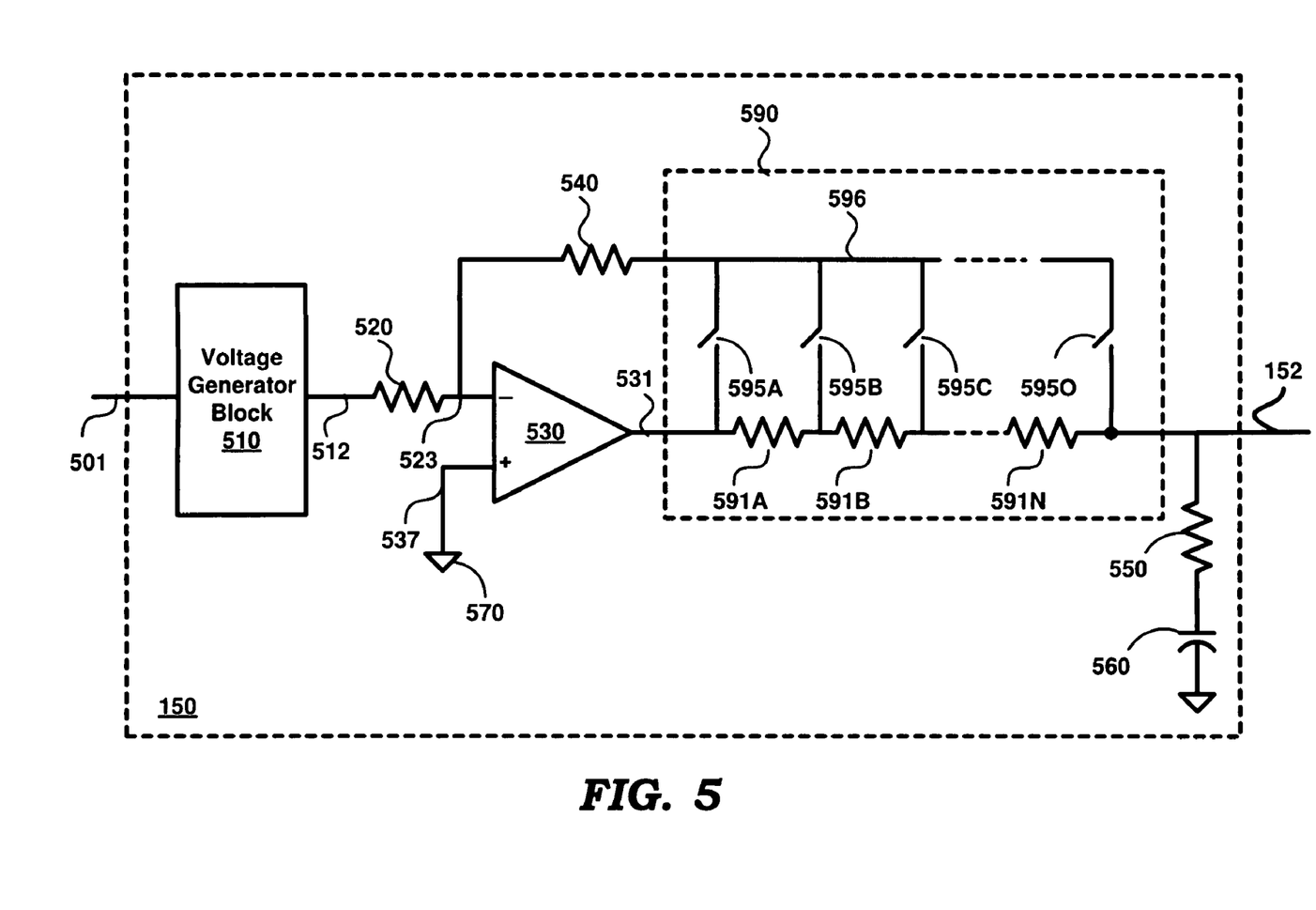
FIG. 5 is a block diagram of a voltage reference in an embodiment of the present invention.

FIG. 5 is a block diagram of a voltage reference in an embodiment of the present invention. Voltage reference 150 is shown containing voltage generator block 510, buffer 530, resistors 520 and 540, programmable resistance block 590, and capacitor 560. Resistor 550 represents the effective series resistance (ESR) of capacitor 560, and may be due to N-well and poly-silicon resistance of the capacitor, etc. Terminal 570 represents ground (reference potential). Output voltage (reference voltage) of voltage reference 150 is provided on path 152. Each block/component of voltage reference 150 is described in detail below.

Voltage generator block 510 receives a power supply on path/node 501, and generates a fixed voltage on path/node 512. Voltage generator block 510 can be implemented using various well known techniques such as band gap reference, etc., well known in the relevant arts.

Capacitor 560 represents the capacitance between the output terminal 152 and a reference terminal (usually ground 570), and may represent a sum of stray capacitance and one or more decoupling capacitors provided at output terminal 152.

Figure 6:
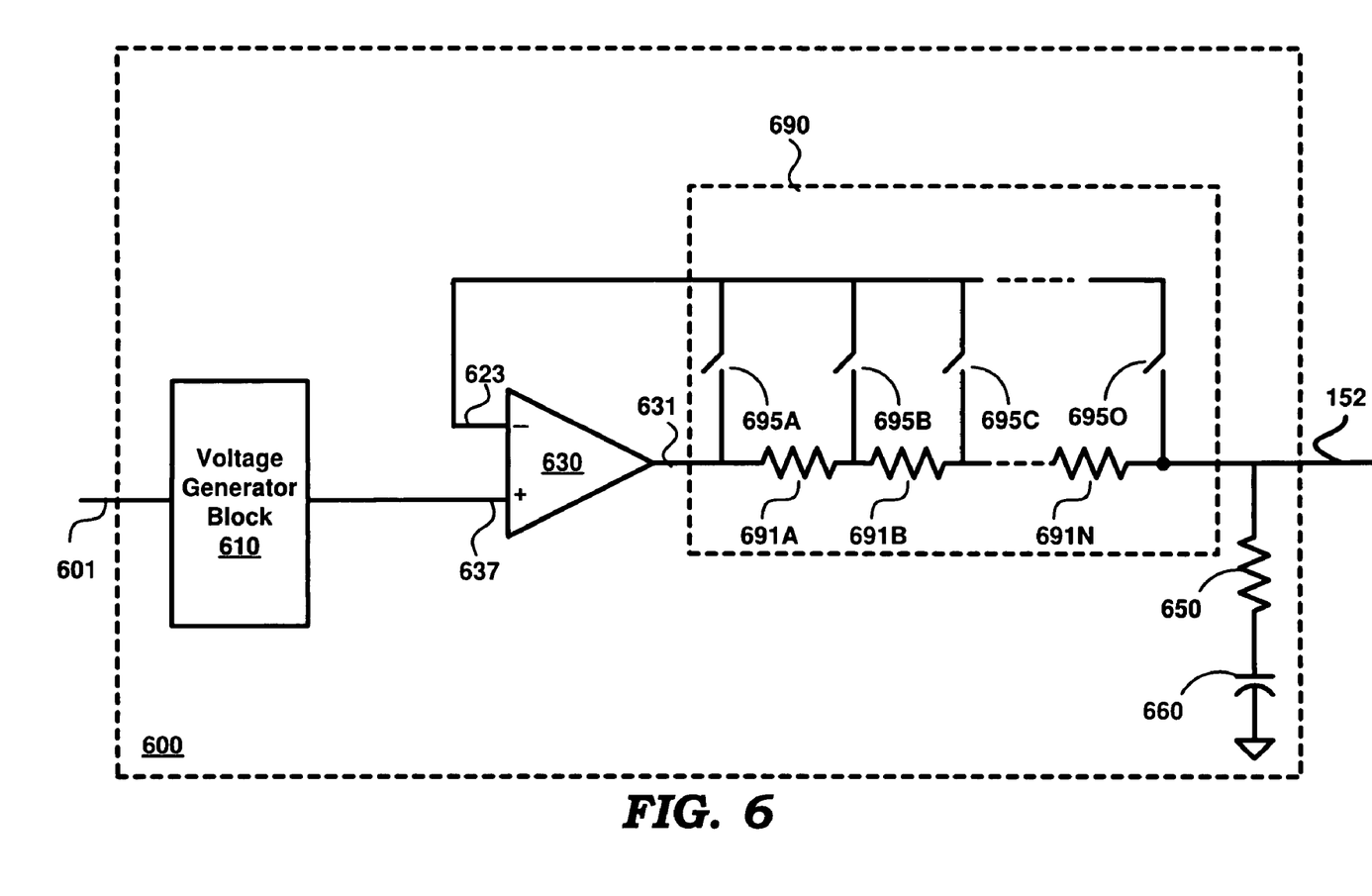
FIG. 6 is a block diagram of a voltage reference in an alternative embodiment of the present invention.

Buffer 530 (which may be implemented as an operational amplifier (OPAMP)) is shown connected in an inverting configuration. Terminals 423 and 437 respectively represent the inverting and non-inverting terminals of buffer 430. While buffer 530 is shown configured as an inverting amplifier with gain, alternative embodiments may be implemented with the buffer connected as a non-inverting buffer with unity gain as shown in FIG. 6, as described briefly below.

The value resistance in the feedback path (output node 531 of buffer 530 to inverting terminal 523) may be varied by closing one or more switches 595A-595O of programmable resistance block 590. Each of switches 595A-595O may be implemented in a known way, for example CMOS analog switches.

For example, closing only switch 595A (with all other switches in block 590 open) provides a feedback resistance equal to resistance of resistor 540, with the sum of resistances 591A-591N being added to the output terminal of buffer 530. On the other hand, for example, closing only switch 595O (with all other switches open) does not add any resistance to the output resistance of buffer 530. It is noted that when only switch 595O is closed, the presence of other resistors 591A-591N in the feedback path does not substantially affect the gain/operation of buffer 530 due to the inherent large loop gain of buffer 530 determined principally by DC gain of buffer 530 and the values of resistors 520 and 540. Similarly, the closing of other switches does not substantially affect the gain/operation of buffer 530.

Each of switches 595A-595O may be controlled to be off/on by corresponding control signals not shown in FIG. 5, but which may be generated internally or provided from an external source, for example an external pin.

Path (or node) 596 may be viewed as a common node to which a terminal each of all switches in programmable resistance block 590 are connected. It may be appreciated that the inclusion of programmable resistance block 590 enables varying the output resistance of buffer 530. Programmable resistance block 590 may, thus, be viewed as a programmable portion of the output resistance of buffer 530. Various alternative techniques, some of which are well known in the relevant arts, can be used to implement programmable resistance block 590. In an embodiment, each of resistors 591A-591N in programmable resistance block 590 has a value of (approximately) 0.1 ohms, and the total number of resistors (591A-591N) is twenty (i.e., a total/sum resistance of all resistances (approximately) equaling 2 ohms).

FIG. 6 illustrates an alternative embodiment (voltage reference 600) in which a buffer is configured as a non-inverting buffer with unity gain. In FIG. 6, voltage generator block 610, path 601, resistor 650 and capacitor 660 correspond respectively to voltage generator block 510, path 501, resistor 550 and capacitor 560 of FIG. 5.

Programmable resistance block 690 corresponds to programmable resistance block 590 (FIG. 5), with switches 695A-695O and resistors 691A-691N corresponding respectively to switches 595A-595O and resistors 591A-591N. Buffer 630 corresponds to buffer 530 (FIG. 5). Buffer 630 is, however, connected as a unity gain, non-inverting amplifier, as may be observed from FIG. 6. Path (or node) 623 (inverting terminal of buffer 630) is connected to what may be viewed as a common node to which a terminal each of all switches in block 690 are connected. Output of voltage generator block 610 is connected to non-inverting terminal 637 of buffer 630.

Figure 7A:
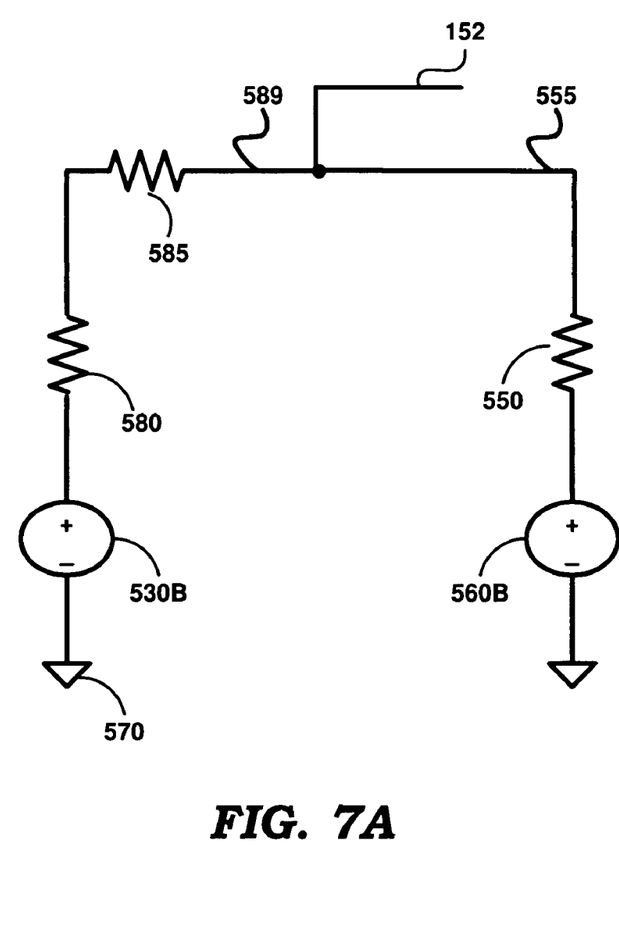
FIG. 7A is a diagram illustrating a circuit equivalent of portions of a voltage reference in an embodiment of the present invention.

FIG. 7A illustrates a circuit equivalent of the relevant portions of voltage reference 150 of FIG. 5 (and also of voltage reference 600 of FIG. 6, although only the corresponding portions of FIG. 5 are referred to in the description below). In FIG. 7A, voltage source 530B is an ideal representation of buffer 530, and voltage source 560B is a voltage source representation of (ideal) capacitor 560. Resistor 580 represents the output resistance of buffer 530 (including (in addition) any stray resistance of track/wiring, for example, on path 531 etc.). Resistor 585 represents the programmable value of resistance (programmable portion of output resistance of buffer 530) added in the path from node 531 to output node 152.

It may be appreciated that selecting additional (or no) resistance from programmable resistance block 590, enables better matching between the output resistance (total output resistance now equal to fixed part 580 plus programmable part 585) of buffer 530 and resistance 550. Such selection/programmability may be done manually or by automatic techniques, as described below with examples.

According to an aspect of the present invention implemented in the context of the component of FIG. 1 (ADC 100), a frequency detection block/circuit (frequency detector 710 of FIG. 7B) is provided (in addition to the blocks shown in FIG. 1) which measures (detects) sampling frequency 141 of the ADC). The frequency detection circuit automatically controls (via respective paths 799A through 799O) switches 595A-595O of FIG. 5 (or 695A-695O of FIG. 6) to be on or off to vary the output resistance of buffer 530, i.e., automatically varies programmable part 585 (FIG. 7A) based on the measured sampling frequency.

Figure 7B:
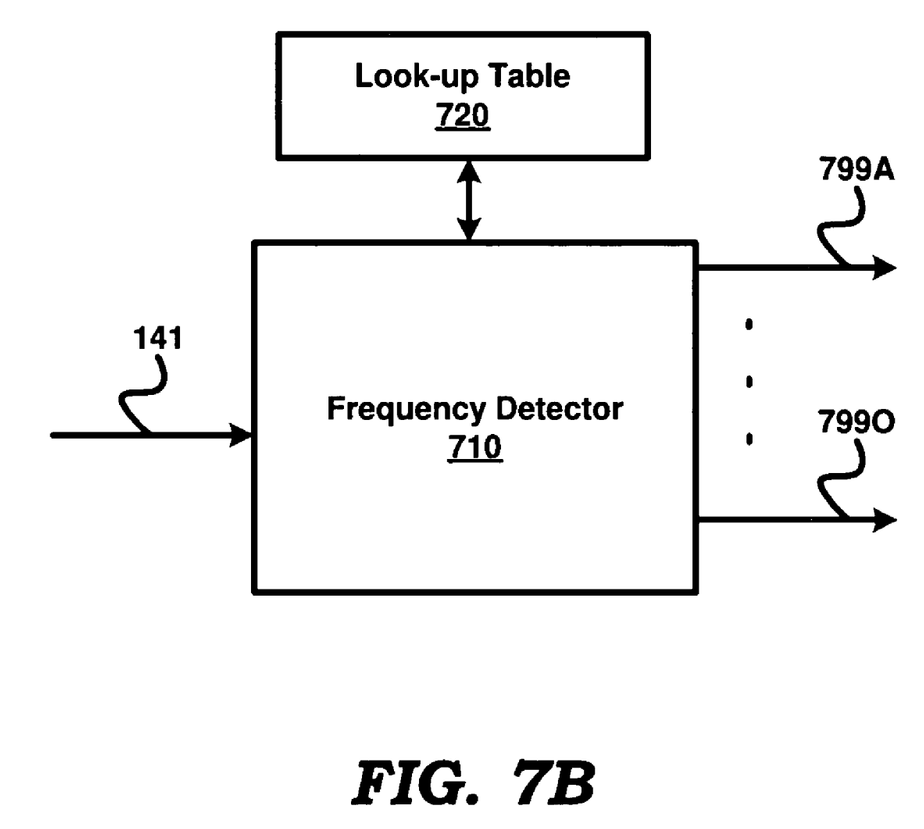
FIG. 7B is a block diagram illustrating a frequency detector generating control signals to operate switches of a programmable resistor block in a voltage reference in an embodiment of the present invention.

The specific switches that are controlled (to be closed) depends on the specific value of programmable resistance part 585. The specific values may be obtained from a lookup table 720. The table may contain multiple entries, with each entry specifying the specific value (or specific switches) for a given range of sampling frequencies.

The sampling frequencies and value combination can be determined empirically and/or based on a priori knowledge of bias currents for buffer 530/630 and the corresponding output resistance of buffer 530/630. As a result, matching of the output resistance of buffer 530/630 with resistance 550 (FIG. 7A) may be done for the entire range of sampling frequencies of an ADC.

It may be appreciated that the provision of frequency detector 710 enables bias currents to be provided with smaller magnitudes when the sampling frequency is lower, while still matching output resistance of buffer 530/630 (denoted as 530B in FIG. 7A) with the ESR 550. Thus, the output resistance may be varied dynamically ("on the fly").

Thus, the above described example represents an example approach to use the programmable resistor block to make dynamic adjustments during operation. Such adjustments are applicable to ADCs, as described above.

According to another aspect of the present invention, the adjustment may be based on hard-programming and potentially applicable to a broader base of devices using voltage references. In the subject scenario, the desired additional value of resistance (from programmable resistance block 590) is determined, and the corresponding switch may be permanently closed, for example by fuse-blow techniques.

Such a feature may be conveniently taken advantage in addressing at least the variations (noted above) caused due to fabrication, as described next with respect to a flowchart.

6. Cancelling Non-linearity Otherwise Caused by Fabrication Process

Figure 8:
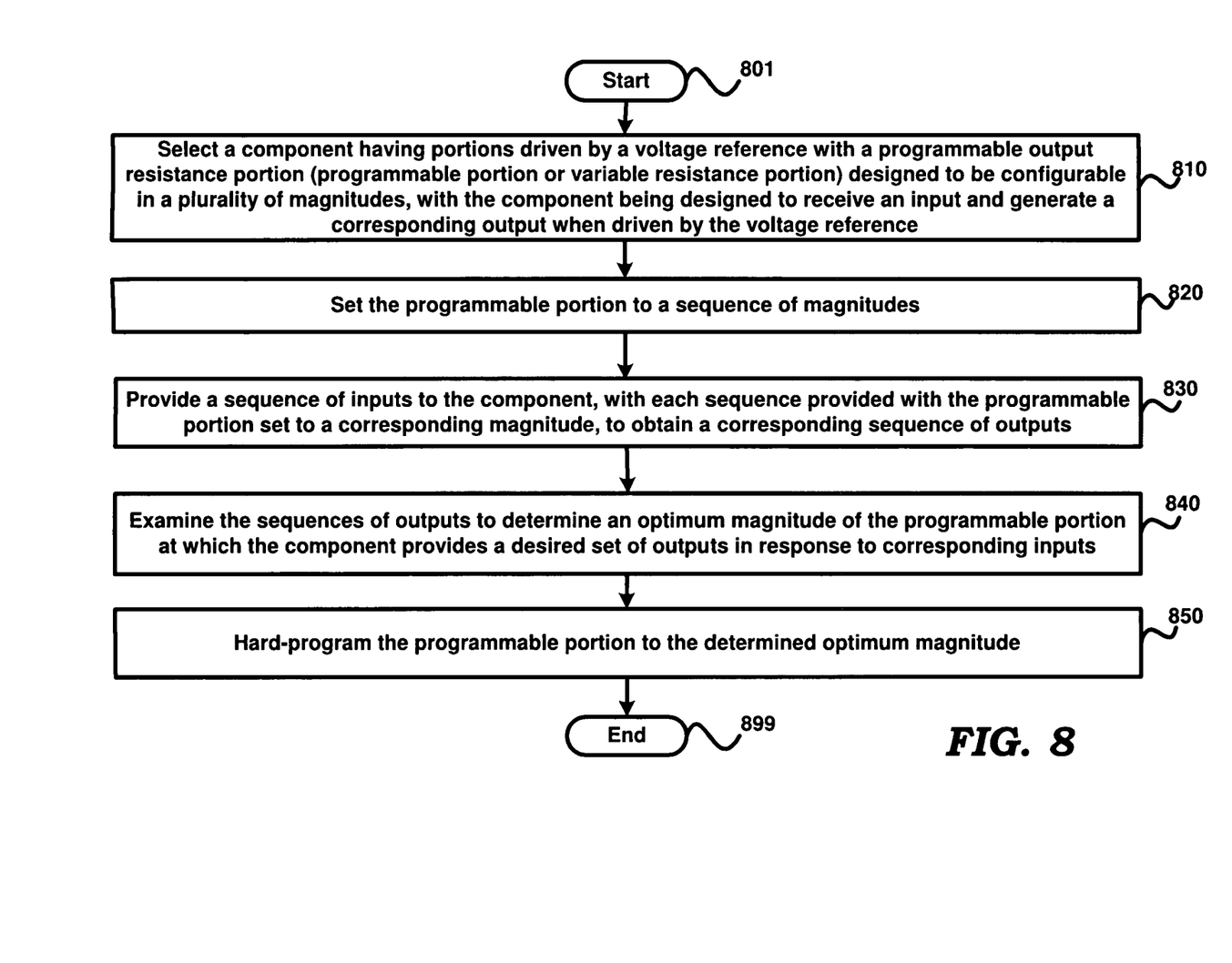
FIG. 8 is a flowchart illustrating the manner in which non-linearity otherwise caused by fabrication process can be cancelled in the implementation of voltage references according to an aspect of the present invention.

FIG. 8 is a flowchart illustrating the manner in which non-linearity otherwise caused by fabrication process can be cancelled in the implementation of voltage references according to an aspect of the present invention. The flowchart is described with respect to FIGS. 5 and 7, and the components of FIG. 1, merely for illustration. However, various features can be implemented in other environments and other components. Furthermore, the steps are described in a specific sequence merely for illustration.

Alternative embodiments in other environments, using other components, and different sequence of steps can also be implemented without departing from the scope and spirit of several aspects of the present invention, as will be apparent to one skilled in the relevant arts by reading the disclosure provided herein. The flowchart starts in step 801, in which control passes immediately to step 810.

In step 810, a component is selected having portions driven by a voltage reference with a programmable output resistance portion (programmable portion or variable resistance portion) designed to be configurable in one of a multiple of magnitudes. The component is designed to receive an input and generate a corresponding output when driven by the voltage reference. As an example, ADC 100 of FIG. 1 may be implemented with voltage reference 150 of FIG. 5 driving corresponding internal circuitry. ADC 100 may be provided a sine wave input, and generate corresponding digital codes representing the sine wave. Control then passes to step 820.

In step 820, the programmable portion is set (iteratively) to a sequence of magnitudes. For example, for a first iteration, only switch 595A may be closed (all other switches open), such that the output resistance now includes the resistance contributions of resistors 591A-591N. For a next iteration, only switch 595B may be closed (all other switches open), such that the output resistance now includes the resistance contributions of resistors 591B-591N. Control then passes to step 830.

In step 830, a sequence of inputs is provided to the component, with each sequence provided with the programmable portion set to a corresponding magnitude, to obtain a corresponding sequence of outputs. For example, ADC 100 may be provided a sine wave, with the sequence of inputs representing sampled values (path 111, FIG. 1) of the sine wave, and only switch 595A may be closed (all other switches open) as noted above in step 820. During a next iteration, the same sequence of inputs (i.e., the same sine wave in terms of frequency, magnitude, phase etc) may be provided to ADC 100, with switch 595B closed, as noted above with respect to step 830. ADC 100 generates a corresponding sequence of outputs (digital codes representing the input) for each combination of input sequence and magnitude of the programmable portion ("magnitude-sequence combination"). Control then passes to step 840.

In step 840, the corresponding sequences of outputs are examined to determine an optimal magnitude of the programmable portion of the output resistance at which the component provides a desired set of outputs in response to corresponding inputs. Continuing with the example noted in the steps above, the optimal (or acceptable) magnitude is determined to be the one(s) corresponding to which the third harmonic component (three times the frequency of the input sine wave) contained in the output digital codes has a magnitude below a desired threshold. It is deemed that the scenario described above (the third harmonic being less than a desired threshold) corresponds to the output resistance of buffer 530 and resistance 550 being most closely matched, and therefore output voltage 152 having minimum (least) non-linearity. Control then passes to step 850.

In step 850, the programmable portion is hard-programmed to the determined optimum magnitude. Hard-programming implies closing the corresponding switch with at least some level of permanence such that the magnitude is not changed dynamically during operation. In case fuse blowing approach, hard-programming may be performed by blowing a fuse. Control then passes to step 899, in which the flowchart ends.

It may be appreciated that the features illustrated by the flowchart described above may be implemented manually or automatically for each of voltage references fabricated potentially in different batches, prior to deployment in a device/system. As a consequence, the sum of resistances 580 and 585 (after the hard-programming) would substantially equal the resistance of resistor 550, thereby ensuring reduced non-linearity of the output voltage on path 152 despite variations in load current.

Further, it may also be appreciated that the current consumed by buffer 530 current may be scaled optimally for various desired operating speeds, and the programmable resistance portion can be changed to account for the resulting output impedance of buffer 530. Therefore voltage reference 150 (or 600) may be operated across a much wider speed range while optimizing power consumption.

A voltage reference implemented as described above may be incorporated in a device/system, as described next.

7. System/Device

Figure 9:
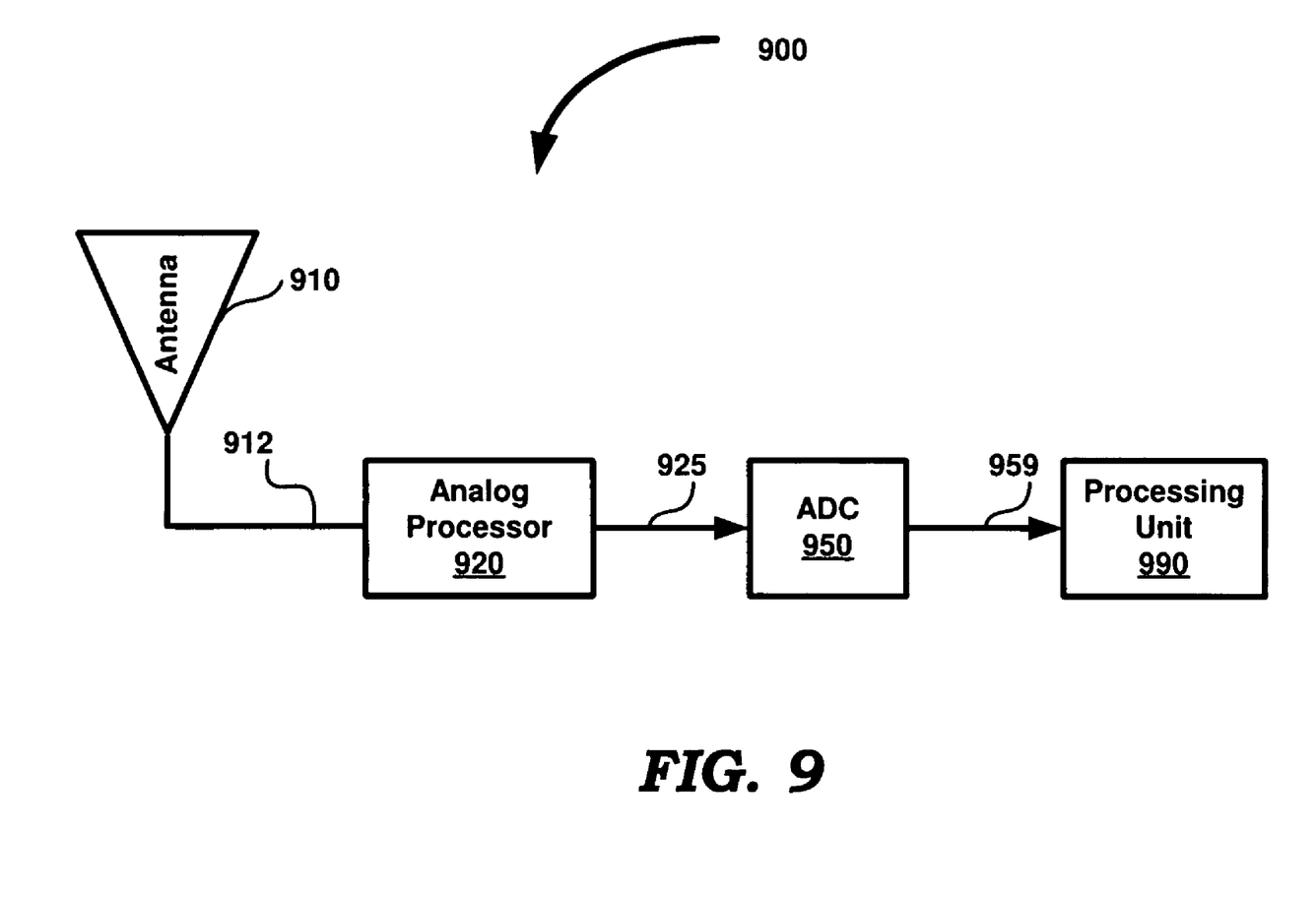
FIG. 9 is a block diagram of a receiver system illustrating an example system in which several aspects of the present invention may be implemented.

FIG. 9 is a block diagram of receiver system 900 illustrating an example system in which several aspects of the present invention may be implemented. Receiver system 900, which may correspond to, for example, a mobile phone is shown containing antenna 910, analog processor 920, ADC 950, and processing unit 990. Each component is described in further detail below.

Antenna 910 may receive various signals transmitted over a wireless medium. The received signals may be provided to analog processor 920 on path 912 for further processing. Analog processor 920 may perform tasks such as amplification (or attenuation as desired), filtering, frequency conversion, etc., on received signals and provides the resulting signal on path 925.

ADC 950 converts the analog signal received on path 925 to corresponding digital codes at a sampling frequency. ADC 950 may be implemented as a pipeline ADC and may contain a voltage reference with improved linearity, as described above.

ADC 950 provides the digital codes to processing unit 990 on path 959 for further processing. Processing unit 990 receives the recovered data to provide various user applications (such as telephone calls, data applications).

While the implementation of voltage reference provided according to an aspect of the present invention are described as being implemented in a ADC component (in turn in receiver system 900), it should be appreciated that the features described above can be implemented in various other components/systems, without departing from the scope and spirit of several aspects of the present invention, as will be apparent to one skilled in the relevant arts by reading the disclosure provided herein.

While various embodiments of the present invention have been described above, it should be understood that they have been presented by way of example only, and not limitation. Thus, the breadth and scope of the present invention should not be limited by any of the above-described embodiments, but should be defined only in accordance with the following claims and their equivalents.

What is claimed is:

1. An article of manufacture containing a voltage reference providing an output reference voltage on an output reference node, said output voltage reference for driving a plurality of external components, each external component offering a load at said output node, said article of manufacture comprising:

the voltage reference including:

a) a voltage generator to generate a voltage signal at a first inverting node;

b) a first signal path between said first inverting node and said output node including a fixed part, wherein said voltage signal is provided via said first signal path to said output node, said first signal path being characterized by a first resistance;

c) a second signal path coupled between an output of the amplifier and said output node, wherein said second signal path is characterized by a second resistance, d) a capacitor also having an effective series resistance coupled to the second signal path and also coupled to the ground;

e) a programmable resistance in series with said first resistance in said first signal path, wherein said programmable resistance includes switches that configure resistances of aid programmable resistance to be either inside or outside of a feedback path of a buffer of said article of manufacture, to vary a magnitude of said programmable resistance, thereby altering the first resistance, the plurality of external components including:

a frequency detector block to measure a frequency of a sampling clock used in sampling an input signal containing an input sample, and to set said programmable resistance to a specific value according to said frequency, such that there is a matching between a total fixed part resistance plus programmable part resistance that is equal to the effective resistance, wherein the effective resistance changes as a result of at least of said change of frequency, whereby a non-linearity of said output node can be reduced by varying said magnitude of said programmable resistance of said buffer of said voltage reference.

2. The article of manufacture of claim 1, wherein said first signal path comprises:

said buffer coupled to receive said voltage signal from said first node, wherein said programmable resistance is coupled between an output of said buffer and said output node.

3. The article of manufacture of claim 2, wherein said programmable resistance is hard programmed to a value such that the output resistance of said buffer at least substantially equals said second resistance.

4. The article of manufacture of claim 3, wherein said programmable resistance comprises:

a plurality of resistors connected in series between said output of said buffer and said output node, a sequence of junctions being formed between each pair of resistors, said output of said buffer and a first one of said plurality of resistors, and said output node and a last one of said plurality of resistors; and a plurality of switches, each of said plurality of switches to connect a corresponding one of said sequence of junctions and a common node.

5. The article of manufacture of claim 4, wherein said buffer contains an inverting terminal and a non-inverting terminal, said voltage reference further comprising:

a first resistor coupled between said inverting terminal and said first node; and a second resistor coupled between said inverting terminal and said common node, wherein said non-inverting terminal is connected to a reference potential.

6. The article of manufacture of claim 4, wherein said buffer contains an inverting terminal and a non-inverting terminal, wherein said first node is connected to said non-inverting terminal and said inverting terminal is connected to said common node.

7. The article of manufacture of claim 2, further comprises an analog to digital converter (ADC) to receive said output voltage as a reference signal and to convert an input sample to a corresponding digital code representing a strength of voltage of said input sample in relation to said output voltage.

8. The article of manufacture of claim 7, wherein said ADC comprises a plurality of stages, each stage containing an amplifier, a plurality of capacitors and a plurality of switches, said plurality of switches being operable to connect a number of capacitors to said output voltage depending on a strength of said input sample.

9. The article of manufacture of claim 1, further comprising a memory storing a look-up table to store a plurality of entries, with each entry specifying a value of said programmable resistance for a corresponding value of said frequency, wherein said frequency detector block is operable to examine said look-up table and determine said specific value according to the measured value of said frequency.

10. A device comprising:

a processor to process a sequence of digital values;

an analog to digital converter (ADC) to generate said sequence of digital values from an input signal based on a reference voltage; and a voltage reference to generate an output voltage as said reference voltage on an output node, said voltage reference comprising:

a voltage generator to generate a voltage signal at a first non-inverting node of the amplifier;

a first signal path programmable between a second inverting node and said output node, wherein said voltage signal is provided via said first signal path from said output node to said second inverting node, said first signal path being characterized by a first resistance;

a second signal path coupled between an output of the amplifier and said output node, wherein said second signal path is characterized by a second resistance; and e) a capacitor also having an effective series resistance coupled to the second signal path and also coupled to ground;

a programmable resistance in said first signal path, wherein said programmable resistance includes switches that configure resistances of said programmable resistance to be either inside or outside of a feedback path of a buffer of said article of manufacture, to vary a magnitude of said programmable resistance, thereby altering the second resistance, a plurality of external components including:

a frequency detector block to measure a frequency of a sampling clock used in sampling an input signal containing an input sample, and to set said programmable resistance to a specific value according to said frequency such that there is a matching between a programmable part and the effective resistance, wherein the effective resistance changes as a result of at least of said change of frequency, whereby a non-linearity of said output node voltage can be reduced by varying said magnitude of said programmable resistance of said buffer of said voltage reference.

11. The device of claim 10, wherein said first signal path comprises:

said buffer coupled to receive said voltage signal from said first node, wherein said programmable resistance is coupled between an output of said buffer and said output node.

12. The device of claim 11, wherein said programmable resistance is hard programmed to a value such that the output resistance of said buffer at least substantially equals said second resistance.

13. The device of claim 12, wherein said programmable resistance comprises:

a plurality of resistors connected in series between said output of said buffer and said output node, a sequence of junctions being formed between each pair of resistors, said output of said buffer and a first one of said plurality of resistors, and said output node and a last one of said plurality of resistors; and a plurality of switches, each of said plurality of switches to connect a corresponding one of said sequence of junctions and a common node.

14. The device of claim 13, wherein said buffer contains an inverting terminal and a non-inverting terminal, said voltage reference further comprising:

a first resistor coupled between said inverting terminal and said first node; and a second resistor coupled between said inverting terminal and said common node, wherein said non-inverting terminal is connected to a reference potential.

15. The device of claim 11, further comprises an analog to digital converter (ADC) to receive said output voltage as a reference signal and to convert an input sample to a corresponding digital code representing a strength of voltage of said input sample in relation to said output voltage.

16. The device of claim 15, wherein said ADC comprises a plurality of stages, each stage containing an amplifier, a plurality of capacitors and a plurality of switches, said plurality of switches being operable to connect a number of capacitors to said output voltage depending on a strength of said input sample.

17. The device of claim 1, further comprising a memory storing a look-up table to store a plurality of entries, with each entry specifying a value of said programmable resistance for a corresponding value of said frequency, wherein said frequency detector block is operable to examine said look-up table and determine said specific value according to the measured value of said frequency.

18. The device of claim 16, further comprising an analog processor to receive an analog signal at a first frequency and generating said input signal at a lower frequency than said first frequency, wherein said input signal at said lower frequency is processed by said ADC.

19. A method of providing voltage references with reduced non-linearity, said method comprising:

selecting a component having portions driven by a voltage reference, said voltage reference designed to contain a programmable output resistance portion, wherein said programmable output resistance portion is designed to be configurable in a plurality of magnitudes, wherein said component is designed to receive an input and generate a corresponding output when driven by said voltage reference, the output also having a capacitive element coupled to a ground, the capacitive element having an effective resistance, wherein an output resistance of said component is therefore at least a function of an input frequency of said component;

setting said programmable output resistance portion to a sequence of magnitudes;

providing a sequence of inputs to said component, wherein each of said sequence of inputs is provided corresponding to a corresponding one of said sequence of magnitudes such that each of a sequence of outputs is generated by said component in response to a corresponding one of a magnitude-sequence combination;

examining said sequence of outputs to determine an optimum magnitude at which said component provides a desired set of outputs in response to corresponding inputs, wherein the examining includes measure a frequency of a sampling clock used in sampling an input signal containing an input sample, and to set said programmable resistance to a specific value according to said frequency such that there is a matching between a fixed part and a programmable part to the effective resistance, wherein the effective resistance changes as a result of at least of said change of frequency, whereby a non-linearity of said output node voltage can be reduced by varying said magnitude of said programmable resistance of said buffer of said voltage reference; and hard-programming said programmable output resistance portion to said optimum magnitude, wherein said programmable resistance includes switches that configure resistances of said programmable resistance to be either inside or outside of feedback path of a buffer of said component, to vary a magnitude of said programmable resistance.

20. The method of claim 19, wherein said component is an analog to digital converter (ADC), said sequence of inputs is a sine-wave, and said desired set of outputs contains a third harmonic of said sine-wave below a desired threshold.

21. The article of manufacture of claim 1, wherein the plurality of external components further comprises a plurality of stages of a pipeline coupled to the output node, each stage having an amplifier, wherein a change of a variable resistance of stage amplifiers, which is conveyed as a change of resistance seen at the output node, is compensated for by the change of said programmable resistance of buffer of said article of manufacture.

22. The article of manufacture of claim 10, further comprising a plurality of stages of a pipeline coupled to the output node, each stage having an amplifier, wherein a change of a variable resistance of stage amplifiers, which is conveyed as a change of resistance seen at the output node, is compensated for by the change of said programmable resistance of buffer of said device.

* * * * *